(12) United States Patent
Dartois

(10) Patent No.: US 6,392,482 B1
(45) Date of Patent: *May 21, 2002

(54) METHOD FOR LINEARIZING, OVER A WIDE FREQUENCY BAND A TRANSMISSION CHAIN COMPRISING A POWER AMPLIFIER

(75) Inventor: Luc Dartois, Carrieres sous Poissy (FR)

(73) Assignee: Alcatel, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/559,333

(22) Filed: Apr. 27, 2000

(30) Foreign Application Priority Data

Feb. 10, 2000 (EP) .............................. 00400395

(51) Int. Cl.7 ................................ H03F 1/00
(52) U.S. Cl. ................. 330/151; 330/149; 375/296; 455/63
(58) Field of Search ............... 330/149, 151; 375/296, 297; 455/63

(56) References Cited

U.S. PATENT DOCUMENTS

| | | | |
|---|---|---|---|
| 5,477,187 A | * 12/1995 | Kobayashi et al. | ........... 330/52 |
| 5,485,120 A | * 1/1996 | Anvari | ........................ 330/151 |
| 5,760,646 A | 6/1998 | Belcher et al. | |
| 6,011,434 A | * 1/2000 | Sakai | ........................... 330/151 |
| 6,211,733 B1 | * 4/2001 | Gentzler | ..................... 330/149 |
| 6,215,354 B1 | * 4/2001 | Kolanek et al. | ................ 330/2 |

FOREIGN PATENT DOCUMENTS

WO    WO 99/22444    5/1999

* cited by examiner

Primary Examiner—Robert Pascal
Assistant Examiner—Henry Choe
(74) Attorney, Agent, or Firm—Sughrue Mion, PLLC

(57) ABSTRACT

The invention concerns a transmission equipment for a telecommunication system operating on a wide frequency band, which equipment contains: a signal branch (32) including an analog chain (12'), a power amplifier (14') associated to a feedforward linearization circuit including: a first subtractor (16') having a first input (16'$_2$) receiving a signal representing the input of the amplifier and a second input (16'$_1$) representing the output of this amplifier, residual error amplifier (20') which amplifies the output of the first subtractor, and a second subtractor (22') which subtracts the output of the residual error amplifier from the output of the power amplifier (14'), the signal branch containing predistortion means (40) which provide correction signals depending on the output signal of the power amplifier. The equipment contains a reference branch (30) providing, to the first input (16'$_2$) of the first subtractor (16'), a signal which is independent from the predistortion of the signal branch.

19 Claims, 2 Drawing Sheets

METHOD FOR LINEARIZING, OVER A WIDE FREQUENCY BAND A TRANSMISSION CHAIN COMPRISING A POWER AMPLIFIER

BACKGROUND OF THE INVENTION

The invention relates to a method for linearizing, over a wide frequency band, a transmission chain comprising a power amplifier.

The constant increase of traffic in the field of telecommunications raises new problems which are not easy to solve for the equipments. More particularly the transmission equipments must operate over an increasing frequency bandwidth in order to be able to transmit simultaneously a great number of channels which operate at different frequencies and/or with different codes. In fact in telecommunication systems each transmitter may operate either on a frequency division multiple access (FDMA) mode or on a coded division multiple access (CDMA) mode or on a combination of both. In the case of CDMA the modulation is spread over a frequency band of several MHz. It is recalled here that in CDMA to each symbol, such as a bit, is superimposed a code which is a sequence at a higher frequency.

The consequence of the increase of the number of channels to be transmitted is also an increase of the transmission power of the transmission equipments.

The most difficult problem to solve with such increase of power together with the increase of the frequency bandwidth is the linearization of the transmission chains, more particularly the linearization of power amplifiers.

Generally power amplifiers are used near saturation in order to obtain the most efficient use of such amplifiers. However near saturation each amplifier has a non linear behavior, i.e. the gain decreases sharply for high input signals compared to small input signals; moreover the output signal is phase distorted due to the well known AM-PM conversion, i.e. the conversion of amplitude modulation into phase modulation.

When several channels are transmitted simultaneously the difficulty of linearization is increased by the fact that the sum of signals corresponding to these different channels, i.e. different frequencies, presents generally a non-constant envelope, i.e. the sum of such signals varies with time. The non-constant envelope must be transmitted correctly, i.e. with an amplifier working linearly in order, on one hand, to transmit signals with a good quality and, on the other hand, to prevent the transmission of interferences that would pollute the spectrum of same or other operators.

The difficulty of the problem is also increased by the fact that the higher the frequency, the lower is the yield of the amplifiers.

Several technologies are used for linearizing power amplifiers. However none of the conventional technologies is able to provide a transmission chain which may be manufactured at reasonable costs and/or with a reasonable volume, and which is able to minimize the transmission of interferences.

For a wide band amplifier the ability to minimize the transmission of interferences is characterized by the SFDR parameter, i.e. the "spurious free dynamic range". This parameter is expressed in dB. It is the ratio between the highest of the useful transmitted powers and the maximum stray signal in the useful frequency band. In the GSM standard this SFDR parameter must be at least equal to 75 dB and in the UMTS future standard this SFDR gain is set to be at least 70 dB.

The main solution which is known, up to now, for the linearization over a wide frequency band of a non-constant envelope signal is the feedforward technology wherein no feedback loop is provided. This technology corrects, in real time, the non-linearities, even if they are frequency dependent. The non-linearities are measured by a comparison with a linear signal before amplification and they are substracted in phase opposition from the output signal of the amplifier to linearize.

A conventional feedforward linearization circuit is represented schematically on FIG. 1:

The digital signals to transmit are first processed by a digital input processor 10 and the processed digital signals are transmitted, through an analog chain 12, to the input of a power amplifier 14. For the linearization of such amplifier the output signal is transmitted to the first input $16_1$ of a first subtractor 16 through an attenuator 18. The second input $16_2$ of subtractor 16 receives the input signal of amplifier 14. The output of the first subtractor 16 is amplified by a residual error amplifier 20, the output of which is connected to the input $22_1$ of a second subtractor 22, the other input $22_2$ of which receives the output of amplifier 14 through a delay device 24.

The purpose of the feedforward circuit, with subtractors 16 and 22 and amplifier 20, is to linearize the amplifier 14 itself.

However in the transmission equipment non-linearities are also introduced by the analog chain 12 and error amplifier 20, limiting the overall linearizing effect.

In order to correct the non-linearities introduced by analog chain 12 it is known to provide the circuit 10 with digital correction means which realize a digital predistortion. These correction means comprise, for instance, look-up tables which, in view of the output of amplifier 14 provide predistortion values. As shown on FIG. 1 the output of amplifier 14 is connected to a corresponding input $10_1$ of circuit 10.

As the goal of the predistortion means in circuit 10 is to correct the non-linearities of the combination of analog chain 12 with amplifier 14 but not to correct independently the distortions introduced by the analog chain 12, the amplifier 20 receives non linearized signals because the signals at the input of the amplifier 14 are distorted by analog chain 12. Therefore the input signal of residual error amplifier is at a relatively high level, about 10% of the level of signals at the input of amplifier 14. Moreover, as already mentioned, the amplifier 20 itself, which is non-linearized, may introduce non-linearities.

In brief the circuit represented on FIG. 1 is power consuming and is unable to provide a quality which is sufficient for wide band transmissions.

The invention overcomes these drawbacks.

The invention provides also a transmission equipment for a base station of a cellular telecommunication system which can transmit, and receive, signals according to different standards, for instance signals with a multiplicity of carriers and with a multiplicity of codes.

SUMMARY OF THE INVENTION

The transmission circuit according to the invention comprises:
  input digital processing means with predistortion means receiving input signals from the output of a power amplifier,
  these digital processing means being connected to the input of the power amplifier through an analog chain, and the power amplifier is associated with feedforward linearization means including a first subtractor which generates the difference between a signal representing the input signal of the amplifier and a signal representing the output signal of this amplifier, this difference being amplified by a residual error amplifier in order to be subtracted from the output signal of the power amplifier.

This transmission circuit is characterized by the fact that it comprises a reference branch for generating a signal representing the input signal of the amplifier which is provided to the first subtractor of the feedforward means, this reference branch providing a signal which is independent from the output signal of the power amplifier.

In other words the reference which is used for the feedforward circuit is independent from the predistortion, or precorrection, of the signal, or power, branch comprising the digital processing means and the analog chain. Therefore the reference signal provided to the first subtractor is not distorted by the predistortion in the signal branch and the output of the first subtractor may be at a lower level (for instance about 20 dB) than the output of the corresponding subtractor 16 in the conventional circuit represented on FIG. 1. Moreover the error represents the residual difference between the reference signal and the predistorted amplified signal; therefore the better is predistortion, the lower is this residual error. For these reasons the power of the residual error to be amplified may be drastically reduced and the quality of the output signal of this residual error amplifier is improved with a lower power class error amplifier.

The reference branch may be similar to the signal branch, i.e. it may comprise digital processing means and an analog chain.

In an embodiment, the digital signal processing means of the reference branch comprise predistortion means which receive their input signal from the output of the analog chain of this reference branch. It is to be pointed out here that these predistortion means of the reference branch keep the independence between the feedforward circuit and the predistortion means of the signal branch. These predistortion means of the reference branch may further decrease by 20 dB (from −60 to −80 dBc) the level of spurrii at the reference output.

Although the signal, or power, branch and the reference branch are independent they preferably have common elements such as, for instance, sampling oscillators and/or local oscillators to guarantee phase matching of signals at the out-put of the first subtractor and, therefore, minimize the residual signal representation (for example 50 dB below input level) on top of the error. Compared to the conventional feedforward, this feature contributes to the reduction of dimensioning of the error amplifier.

In a preferred embodiment the power branch comprises equalization means for the amplifier and/or attenuator(s) of the transmission channels. These equalization means are advantageously included in the digital processing means of the power branch. They provide a correction for each frequency, or each frequency subband, in order to minimize the contribution of the useful signal to the residual error signal. These equalization means may also be used to adjust the level of each carrier or subband, in line with the reference signal.

These equalization means may be preadjusted in factory. However, preferably, they are adjusted from time to time, i.e. updated through a comparison between, on the one hand, the input signal of the digital processing means and, on the other hand, the signal at the output of the power amplifier.

This updating may be improved by a selection of the data which are used for the adjustment of the equalization means; this selection is performed by an analysis of the residual error, which consists in an analysis of the spectrum of this residual error or in an analysis based on correlation. For instance the data which will be selected for updating are those for which the intermodulation interference signals are present at frequencies which are distinct from the useful frequencies.

The predistortion means may also be periodically updated in a similar manner.

Although the feedforward circuit is independent from the linearization of the transmission channel, this circuit may be used in order to improve the linearization provided by the equalization or predistortion means. For instance the operational range of the feedforward circuit may be selected in order to compensate the effects of drifts in the signal branch. In this case the period separating two successive updatings of the predistortion and/or equalization means may be increased.

The operational range of the feedforward circuit may be also selected to compensate for other defects of the power branch such as DC offsets, defects of insulation of local oscillators and frequency images, as well as quadrature defects.

In a further embodiment, the contribution of the useful signal to the residual error may be decreased by adjusting the phase of the reference signal provided at the input of the first subtractor of the feedforward circuit. This phase adjustment is obtained for instance by the provision of a programmable delay circuit which may be installed at the output of the digital signal processing means of the reference branch.

BRIEF DESCRIPTION OF THE DRAWINGS

Other features and advantages of the invention will appear with the description of certain of its embodiments, this description being made which reference to the herein-appended drawings wherein.

MORE DETAILED DESCRIPTION OF THE INVENTION

Figure 1:
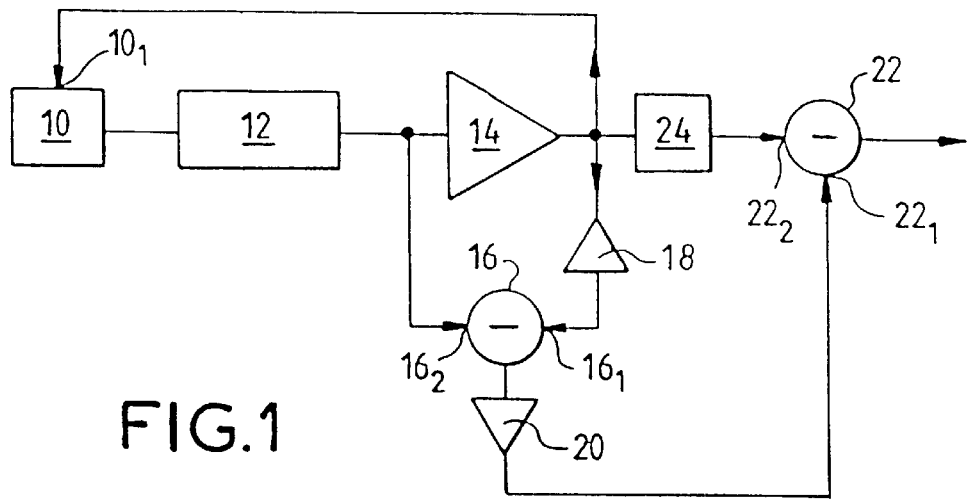
FIG. 1, already described, is a schematic diagram of a conventional transmission device.
Figure 2:
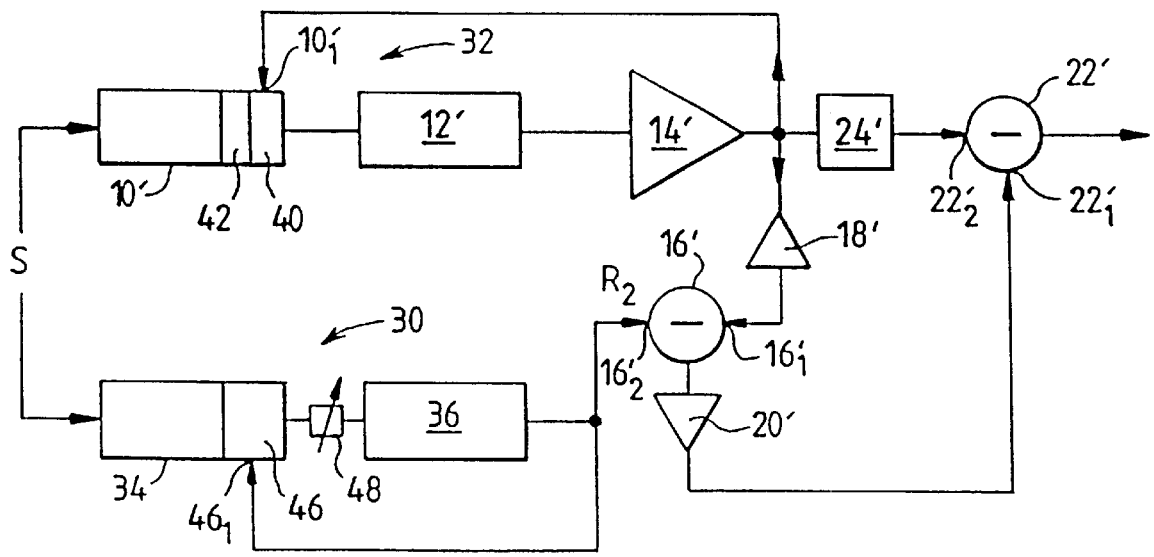
FIG. 2 is a diagram similar to FIG. 1 for a transmitter according to the invention.

In the schematic representation of the invention which appears on FIG. 2 the elements which are similar to those of FIG. 1 have the same reference numerals with a prime (').

As shown the main difference between the conventional transmitter represented on FIG. 1 and the transmitter according to the invention which is represented on FIG. 2 is that the reference input $16'_2$ of the first subtractor 16' does not receive the input of the power amplifier 14' but the output of a reference branch 30.

This reference branch 30 provides a signal which is a faithful representation of the input signal S applied to the signal, or power, branch 32, upstream of the amplifier 14'. The signal branch comprises digital signal processing means 10' and an analog chain 12' between the output of digital processing means 10' and the input of the power amplifier 14'.

The reference branch 30 is similar to signal branch 32, i.e. it comprises a digital signal processor 34 and an analog chain 36 connected between the output of processor 34 and the input $16'_2$ of subtractor 16'.

As in the embodiment of FIG. 1, in the signal branch 32 the digital processor 10' comprises digital predistortion means including, for instance, look-up tables, with an input $10'_1$ connected to the output of power amplifier 14'.

Due to the presence of such predistortion means in the signal branch 32, the role of which is to correct the non-linearities introduced by the combination of the analog chain 12' and of the power amplifier 14', the input of power amplifier 14' (i.e. the output of analog chain 12') is not a true representation of input signal S.

The reference branch 30 provides at its output, i.e. at the input $16'_2$ of subtractor 16', a true representation of input signal S.

Therefore the reference signal of the feedforward circuit comprising subtractor 16', amplifier 20' and the second subtractor 22' is also a true representation of the input signal and provides a perfect, or an almost perfect, reference signal for this feedforward circuit. With respect to the conventional equipment (FIG. 1) the signal at the output of subtractor 16' is considerably reduced and the power of the amplifier 20' may be much smaller than the power of the corresponding amplifier 20.

These equalization means may be preadjusted in factory or adjusted periodically, i.e. updated. This updating is based on a comparison between the input signal and the output of amplifier 14'. This updating is preferably performed only on selected data, i.e. only on data which provide a correct updating. This selection is based on an analysis of the spectrum of the residual error signal at the output of subtractor 16' or at the output of amplifier 20'. The selection criteria are based on the total power of transmitted signal because it is not necessary to update calibrations of predistortion or feedforward on small signals where intermodulation products might be too low. The selection rejects also intermodulation products falling into other useful signal subbands and leading to measurement errors.

A corresponding updating is also performed for the predistortion look-up tables of the signal branch and of the reference branch (which will be described herein after).

This periodic updating of equalization and/or predistortion may be realized as follows: from time to time the signals at the output of amplifier 14' and at the input of subtractor 16' (for predistortion of reference branch) are compared to signal S.

The selection of data to be used for the updating is performed by comparison of the spectrum of signal S with the spectrum of the output of subtractor 16' or through a correlation.

For instance if an intermodulation signal is at the same frequency as a useful signal the corresponding measurement data will not be selected. It is also possible to make the selection through a prediction of the instant when the measurement will provide correct results. The selection may also take into account the total power of the transmitted signals: the measured data will be selected only when this total power will be higher than a given threshold.

The digital processor 34 of the reference branch 30 comprises also predistortion means 46 with a look-up table with an input $46_1$ connected to the output of the analog chain 36.

In this embodiment a delay device 48 is inserted between the output of digital processor 34 and the input of analog chain 36. This delay device 48 is programmable in order that the reference signal R2 applied on input $16'_2$ of subtractor 16' has the correct phase, taking into account possible additional delay of signal amplification chain.

The feedforward circuit, although independent from the signal branch 32 may be used to compensate the residual non-linearities of signal branch 32. In other words the feedforward circuit is a "post cleaner" of defects of the signal branch 32.

Figure 3:
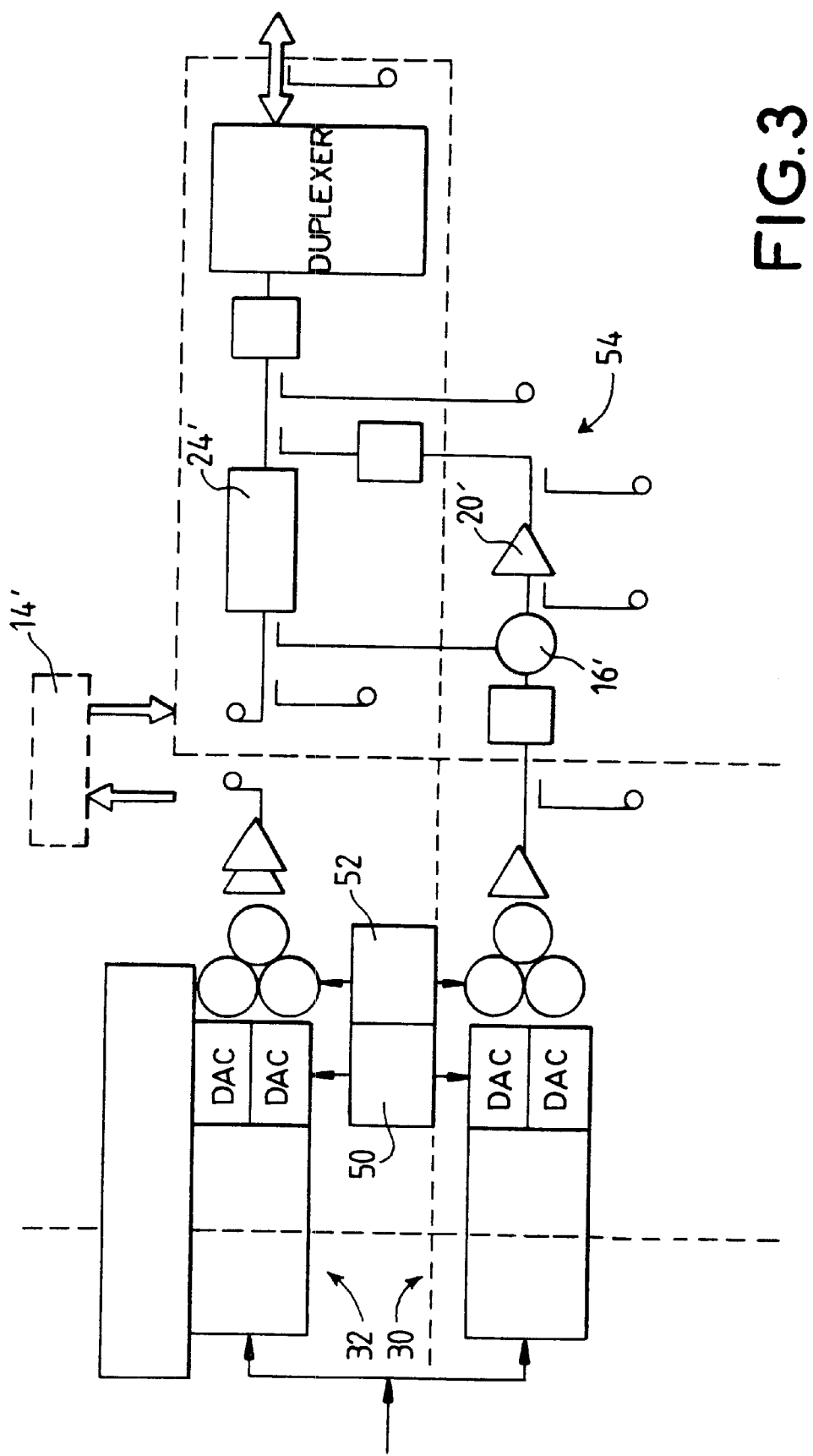
FIG. 3 shows a more detailed embodiment of the invention.

In the embodiment represented on FIG. 3 a common sampling oscillator 50 is used for the digital to analog converters of branches 32 and 30. The same local oscillator 52 is also used for branches 30 and 32.

In this embodiment the feedforward circuit 54, the signal branch 32 as well as the reference branch 30, are modules which may be used independently from the power amplifier 14'.

The transmission equipment represented on FIG. 2 or FIG. 3 may be used for a digital telecommunication system of the second and/or third generation, i.e. of the GSM type and/or of the UMTS type. It transmits correctly a multiplicity of channels on a wide frequency band, each channel corresponding either to a given frequency (carrier) or to a sub-band in case of CDMA. This transmitter may be especially used in base stations which have the possibility to transmit several kinds of standards, for instance base stations which may, from time to time, be reprogrammed by radio programming in order to be adapted to different standards.

An additional advantage of embodiment of FIGS. 2 and 3 is the fact that any implementation error in the signal chain before the power amplifier will be corrected by the feedforward chain "post cleaner" because it is seen, without any a priory model, as a difference with respect to the reference signal. For example if a baseband to RF direct conversion is used with a complex digital modulator, the inherent local oscillator feedthrough and gain and phase mismatch of the modulator will be corrected as far as they are within the SFDR "gain" of the feedforward calibration.

This feedforward calibration is obtained through the use of feedforward calibration elements, comprising an adjustment element for the delay device 24' and gain and phase adjustment means for amplifier 20'. These adjustments are con-trolled by a comparison between the output signal of subtractor 22' and the input $16'_1$ of subtractor 16'.

In an embodiment means are provided for adjusting the gain of amplifier 20' in view of the output of amplifier 14', means are also provided to adjust the attenuation of attenuator 10' in view also of the output of amplifier 14'. Therefore, it is possible to use the feedforward linearization circuit with power amplifiers 14' having different power outputs without changing the reference level and its predistortion.

In a further embodiment, equalization means are provided in the reference branch in order to compensate defects, such as a non-flat frequency response of the analog chain of this reference branch.

It is also possible to provide adjustment means for the group delay, the gain and the phase of the feedforward linearization circuit.

Preferably the adjustment of the feedforward linearization circuit is based on measurement(s) of signals at the output of the residual error amplifier and/or at the output of the second subtractor.

In that case the signals at the output of the residual error amplifier and/or at the output of the second subtractor (22') are measured when a low level and long pseudonoise sequence is injected in the reference or signal branch.

What is claimed is:

1. A transmission equipment for a telecommunication system operating on a wide frequency band, this equipment comprising:
   a signal branch (32) including a first analog chain (12'),
   a power amplifier (14') associated with a feedforward 1 linearization circuit including:
      a first subtractor (16') having a first input (16'$_2$) receiving a signal representing the input of the amplifier and a second input (16'$_1$) representing the output of this amplifier,
      a residual error amplifier (20') which amplifies the output of the first subtractor, and
      a second subtractor (22') which subtracts the output of the residual error amplifier from the output of the power amplifier (14'),
   the signal branch comprising first digital & adaptive predistortion means (40) which provide correction signals depending on the output signal 10'$_1$ of the power amplifier,
   characterized in that said equipment comprises a reference branch (30) providing, to the first input (16'$_2$) of the first subtractor (16') of the feedforward circuit linearizing the power amplifier (14'), a signal which is independent from the predistortion of the signal branch, both the reference & the signal branch being fed with a same digital input stream (S) of baseband signal to be modulated and amplified.

2. A transmission equipment according to claim 1, characterized in that the reference branch comprises second predistortion means (46) in order to correct the non-linearities of this reference branch.

3. A transmission equipment according to claim 2, characterized in that the second predistortion means comprise a look-up table.

4. A transmission equipment according to claim 1, characterized in that the reference branch includes digital signal processing means (34) and a second analog chain (36).

5. A transmission equipment according to claim 1, characterized in that the reference branch comprises an adjustable delay device (48) for adjusting the phase of the reference signal applied to the first input of the first subtractor (16') of the feedforward linearization circuit of the power amplifier.

6. A transmission equipment according to claim 1, characterized in that the signal branch (32) comprises equalization means for adjusting individually the channels to be transmitted reference signal and for minimizing the residual error energy at the input of the residual error amplifier.

7. A transmission equipment according to claim 6, characterized in that it comprises updating means for periodically adjusting the predistortion means of the signal branch and/or of the reference branch and/or for periodically adjusting the equalization means (42), these updating means comprising means for comparing the input signal to the output signal of the power amplifier.

8. A transmission equipment according to claim 7, characterized in that it comprises means for selecting the data at the output of the power amplifier (14') which will be used for the updating.

9. A transmission equipment according to claim 8, characterized in that the frequency spectra of the input signal and of the output signal of the power amplifier are compared in order to make the selection of the data which will be used for the updating.

10. A transmission equipment according to claim 1, characterized in that the power amplifier (14') is a module removable from the transmission equipment.

11. A transmission equipment according to claim 1, characterized in that it comprises a local oscillator (52) and/or a sampling oscillator (50) which is common to the reference branch and to the signal branch.

12. A transmission equipment according to claim 1, characterized in that it comprises means for adjusting the gain of residual error amplifier (20') in view of the output power of the power amplifier (14').

13. A transmission equipment according to claim 12, characterized in that it comprises an attenuator (18') between the output of the power amplifier (14') and the second input (16'$_1$) of the first subtractor (16'), this attenuator including means for adjusting its attenuation in view of the output power of the power amplifier (14').

14. A transmission equipment according to claim 4, characterized in that it comprises equalization means in the reference branch in order to compensate defects, such as a non-flat frequency response of the second analog chain of this reference branch.

15. A transmission equipment according to claim 1, characterized in that it comprises adjustment means for the group delay, the gain and the phase of the feedforward linearization circuit.

16. A transmission equipment according to claim 15, characterized in that the adjustment of the feedforward linearization circuit is based on measurement of signals at the output of the residual error amplifier and/or at the output of the second subtractor (22').

17. A transmission equipment according to claim 16, characterized in that the signals at the output of the residual error amplifier and/or at the output of the second subtractor (22') are measured when a low level and long pseudonoise sequence is injected in the reference or signal branch.

18. The transmission equipment according to claim 1, in a base station for said telecommunication system, wherein said telecommunication system is a cellular telecommunication system.

19. A cellular telecommunication system comprising a base station including said transmission equipment of claim 1.

* * * * *